(12) United States Patent
Chen et al.

(10) Patent No.: US 12,532,785 B2
(45) Date of Patent: Jan. 20, 2026

(54) DISPLAY DEVICE

(71) Applicant: WUHAN CHINA STAR OPTOELECTRONICS TECHNOLOGY CO., LTD., Hubei (CN)

(72) Inventors: Yunni Chen, Hubei (CN); Fancheng Liu, Hubei (CN); Guowei Zha, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 410 days.

(21) Appl. No.: 18/043,455

(22) PCT Filed: Feb. 8, 2023

(86) PCT No.: PCT/CN2023/074972
§ 371 (c)(1),
(2) Date: Feb. 28, 2023

(87) PCT Pub. No.: WO2024/082489
PCT Pub. Date: Apr. 25, 2024

(65) Prior Publication Data
US 2024/0290764 A1 Aug. 29, 2024

(30) Foreign Application Priority Data
Oct. 18, 2022 (CN) .......................... 202211275207.0

(51) Int. Cl.
*H01L 27/12* (2006.01)
*G02B 30/54* (2020.01)
(Continued)

(52) U.S. Cl.
CPC ............ *H01L 25/167* (2013.01); *G02B 30/54* (2020.01); *H10D 86/423* (2025.01);
(Continued)

(58) Field of Classification Search
CPC ..... H01L 25/167; H01L 25/16; H01L 25/075; H01L 25/753; G02B 30/54; G02B 30/52;
(Continued)

(56) References Cited

U.S. PATENT DOCUMENTS 11,508,323 B2 * 11/2022 Shao .......................... G09F 9/37
11,798,510 B2 * 10/2023 Shao .................... G09G 3/3607
(Continued)

FOREIGN PATENT DOCUMENTS

CN 107209394 A 9/2017
CN 107644610 A 1/2018
(Continued)

OTHER PUBLICATIONS

Chinese Office Action issued in corresponding Chinese Patent Application No. 202211275207.0 dated Jan. 13, 2025, pp. 1-8.
(Continued)

*Primary Examiner* — Nikolay K Yushin
(74) *Attorney, Agent, or Firm* — PV IP PC; Peter S. Stecher; Wei Te Chung

(57) ABSTRACT

The present application discloses a display device, including a display panel rotating around a rotation axis. The display panel includes a plurality of driving thin-film transistors arranged along a first direction, and a driving thin film transistor group includes at least two driving thin film transistors. The driving thin film transistors are used to control the corresponding light emitting device to emit light. A current of each driving thin film transistor in the driving thin film transistor group close to the rotation axis is smaller than a current of each driving thin film transistor in the
(Continued)

driving thin film transistor group away from the rotating axis.

20 Claims, 9 Drawing Sheets

(51) Int. Cl.
*H01L 25/16* (2023.01)
*H01L 27/13* (2006.01)
*H10D 86/40* (2025.01)
*H10D 86/60* (2025.01)
*H10H 29/14* (2025.01)

(52) U.S. Cl.
CPC .......... *H10D 86/481* (2025.01); *H10D 86/60* (2025.01); *H10H 29/142* (2025.01)

(58) Field of Classification Search
CPC ...... G02B 30/56; G02B 30/27; H10D 86/423; H10D 86/40; H10D 86/481; H10D 86/60; H10H 29/142; H10H 29/14; H10H 29/10; H10H 29/30; H10H 20/00; H10H 20/01; H10H 20/855; H10H 20/811; H10H 20/82; G09F 9/33; G09F 9/37; G09F 9/30; G09F 9/301; G09F 9/35; G09G 3/00; G09G 3/32; G09G 3/3233; G09G 3/2003; H10K 59/12; H10K 59/124; H10K 59/1213; H10K 59/122
See application file for complete search history.

(56) References Cited

U.S. PATENT DOCUMENTS

| | | | |
|---|---|---|---|
| 2021/0193067 A1* | 6/2021 | Shao | G09G 3/3685 |
| 2022/0077424 A1 | 3/2022 | Park et al. | |
| 2022/0139344 A1* | 5/2022 | Shao | G09G 3/005 |
| | | | 345/204 |
| 2022/0366854 A1* | 11/2022 | Shao | G09G 3/3258 |

FOREIGN PATENT DOCUMENTS

| | | |
|---|---|---|
| CN | 111180492 A | 5/2020 |
| CN | 112241068 A | 1/2021 |
| CN | 112634799 A | 4/2021 |
| CN | 113093402 A | 7/2021 |
| CN | 215674518 U | 1/2022 |
| CN | 115662338 A | 1/2023 |
| JP | H08122789 A | 5/1996 |
| TW | I238679 B | 8/2005 |

OTHER PUBLICATIONS

International Search Report in International application No. PCT/CN2023/074972,mailed on Jul. 18, 2023.
Written Opinion of the International Search Authority in International application No. PCT/CN2023/074972,mailed on Jul. 18, 2023.

* cited by examiner

DISPLAY DEVICE

FIELD OF INVENTION

The invention relates to the field of display technology, and particularly to a display device.

BACKGROUND

At present, there are many types of rotating display devices, and the most common one on the market is a "3D" fan screen. The "3D" fan screen uses LED lamp beads as light-emitting devices, which have problems of low resolution and uneven display. Another scanning-type volumetric three-dimensional display device uses a side of various display screens as an axis to perform rotational scanning to form a cylindrical display space, which makes this type of display device having a higher brightness at a position close to the rotating axis. The overall brightness display of the display panel is uneven, which affects the actual display effect.

At present, main methods for solving above problems are to change a physical structure of a rotating device or to adjust the pixel lighting process through an algorithm. These methods are not universal and greatly increase the complexity of the display method.

SUMMARY

Embodiments of the present invention provide a display device, which can effectively solve the problem of uneven display brightness when a three-dimensional display device displays.

In order to solve the above problems, the application provides following technical scheme.

An embodiment of the present application provides a display device, including:

at least one display panel, wherein the display panel is configured to rotate around a rotation axis to display, the display panel comprises a light emitting layer and a driving device layer that are stacked, the light emitting layer comprises a plurality of first light emitting devices arranged at intervals, the driving device layer comprises a plurality of driving thin film transistor groups arranged in sequence along a first direction, one of the driving thin film transistor group comprises at least two driving thin film transistors, one of the driving thin film transistor is connected to one of the first light emitting devices, and the first direction is perpendicular to the rotation axis.

Herein, a driving current of each of the driving thin film transistors in the driving thin film transistor group close to the rotation axis is smaller than a driving current of each of the driving thin film transistors in the other driving thin film transistor group away from the rotation axis when the first light-emitting device emits light.

In one embodiment, one of the driving thin film transistor groups comprises a plurality of driving thin film transistor sub-groups arranged along the first direction, and one of the driving thin film transistor sub-groups comprises at least two driving thin film transistors, the at least two driving thin film transistors in the driving thin film transistor sub-group are evenly arranged at intervals along a second direction, and the second direction is parallel to the rotation axis.

The driving currents of the driving thin film transistors in each of the driving thin film transistor sub-groups are equal in magnitude in at least one of the driving thin film transistor groups when the light emitting device emits light.

In one embodiment, a width-length ratio of a channel portion of the driving thin film transistor in the driving thin film transistor group close to the rotation axis is smaller than a width-to-length ratio of the channel portion of the driving thin film transistor in another driving thin film transistor group away from the rotation axis in the first direction.

In one embodiment, the driving thin film transistor at least comprises a gate, a source, a drain, and an active layer, and the active layer comprises a channel portion distributed between the source and the drain.

In one embodiment, the thin film transistor is a low temperature polysilicon thin film transistor, an oxide semiconductor thin film transistor, or an amorphous silicon thin film transistor.

In one embodiment, the display panel comprises a plurality of control circuits, and one of the plurality of control circuits controls at least one of the first light-emitting devices to emit light and display;

the control circuit comprises a first thin film transistor, a second thin film transistor, a third thin film transistor, and a storage capacitor, the first thin film transistor is the driving thin film transistor, the second thin film transistor is a switching thin film transistor, and the third thin film transistor is a detecting thin film transistor.

In one embodiment, the display panel comprises a substrate, the driving device layer is disposed on the substrate, and a material of the substrate is a transparent material.

In one embodiment, a material of the substrate is transparent glass or polyimide.

In one embodiment, the light-emitting layer comprises a plurality of first light-emitting device groups arranged in sequence along the first direction, and the first light-emitting device group comprises at least two of the first light emitting devices.

A distribution density of each of the first light emitting devices in the first light emitting device group close to the rotation axis is smaller than a distribution density of each of the first light emitting devices in another first light emitting device group away from the rotation axis in the first direction.

In one embodiment, one of the first light-emitting device groups comprises at least one first sub-group, and the first sub-group comprises at least two of the first light-emitting devices, the at least two of the first light emitting devices in the first sub-group are arranged in sequence along a second direction, the second direction is parallel to the rotation axis, and the distribution density of the first light emitting devices in each of the first sub-groups in at least one first light emitting device group is the same.

In one embodiment, one of the first light-emitting device groups comprises at least two first sub-groups arranged in the first direction, and the first sub-group comprises a plurality of the first light-emitting devices, and the plurality of the first light-emitting devices are evenly arranged at intervals along the second direction.

In one embodiment, in any two adjacent first sub-groups, the first light-emitting devices in one of the first sub-groups and the first light-emitting devices in the other first sub-group are arranged alternately along the second direction.

In one embodiment, one of the first light-emitting device groups comprises at least two of the first sub-groups, and, in any two of the first light-emitting device groups, a distance between one of the first sub-groups in one light emitting device group is equal to a distance between the first sub-groups in another first light emitting device group.

In one embodiment, an arrangement of the first light-emitting devices is set to m rows and n columns, and the display panel is refreshed when the display panel is rotated by α degrees, then following conditions are satisfied:

the number N of the first light emitting devices in the $t^{th}$ column≥$[(360 \times m \times t)/(\alpha \times n)]$; and the first light emitting devices are evenly distributed on the column, and t is a positive integer greater than 1 and less than or equal to n.

In one embodiment, the display panel comprises a first display portion and a second display portion respectively located on opposite sides of the rotation axis, and the plurality of the first light-emitting device groups located in the first display portion, the second display portion comprises a plurality of second light emitting device groups arranged along the first direction, and the second light emitting device group comprises a plurality of second light emitting devices.

Herein, in the first light emitting device group and the second light emitting device group having the same length from the rotation axis, rotation paths of the plurality of the first light emitting devices on the first light emitting device group and the plurality of second light emitting devices on the two light emitting device groups do not overlap.

In one embodiment, a changing rate of the distribution density of the first light-emitting devices on the first display portion and a changing rate to the distribution density of the second light-emitting devices on the second display portion are symmetrical about the rotation axis.

In one embodiment, a shape of the first display portion and a shape of the second display portion are symmetrical about the rotation axis.

In one embodiment, a distance between each of the first light-emitting device groups and the rotation axis is within a predetermined distance, and the distribution density of light emitting devices is equal outside the preset distance range.

In one embodiment, a distance between each of the driving thin film transistor groups and the rotation axis is within a predetermined distance, and the distribution density of the first light-emitting devices is equal and the values of the driving currents of the driving thin film transistors are equal outside the predetermined distance.

The beneficial effects of the present invention at least include:

In this application, by setting the display panel to rotate around a rotation axis to display, the display panel comprises a light emitting layer and a driving device layer that are stacked. The light emitting layer comprises a plurality of first light emitting devices arranged at intervals, and the driving device layer comprises a plurality of driving thin film transistor groups arranged in sequence along the first direction. One of the driving thin film transistor groups comprises at least two driving thin film transistors, and when the first light emitting device emits light in the first direction, the driving current of each driving thin film transistor in one of the driving thin film transistor groups close to the rotation axis is smaller than the driving current of each driving thin film transistor in the other driving thin film transistor group away from the rotation axis. Since the driving thin film transistors controls the light-emitting device to emit light, and the brightness of the first light-emitting device is positively correlated with the magnitude of the driving current in the driving thin-film transistor. The larger the driving current in the driving thin-film transistor, the higher the brightness of the first light-emitting device. Therefore, the driving current of the driving thin film transistor in the driving thin film transistor group close to the rotation axis is set to be smaller than the driving current of the driving thin film transistor in the driving thin film transistor group away from the rotation axis, which can solve the problem of the three-dimensional display device, which is the brightness unevenness caused by the first light-emitting device at different positions on the display panel due to the difference in rotational linear speed, and the display brightness uniformity of the three-dimensional display device is further improved.

DETAILED DESCRIPTION

The present application provides a display device. In order to make the purpose, technical solution and effect of the present application clearer and clearer, the present application will be further described in detail below with reference to the accompanying drawings and examples. It should be understood that the specific embodiments described here are only used to explain the present application, not to limit the present application.

Embodiments of the present application provide a display device. Each will be described in detail below. It should be noted that the description sequence of the following embodiments is not intended to limit the preferred sequence of the embodiments.

At present, there are many types of rotating display devices, and the most common one on the market is a "3D" fan screen. The "3D" fan screen uses LED lamp beads as light-emitting devices, which have problems of low resolution and uneven display. Another scanning-type volumetric three-dimensional display device uses a side of various display screens as an axis to perform rotational scanning to form a cylindrical display space, which makes this type of display device having a higher brightness at a position close to the rotating axis. The overall brightness display of the display panel is uneven, which affects the actual display effect.

At present, main methods for solving above problems are to change a physical structure of a rotating device or to adjust the pixel lighting process through an algorithm. These methods are not universal and greatly increase the complexity of the display method.

In order to solve the above technical problems, the present application provides following technical solutions, specifically referring to the following embodiments and the accompanying drawings FIGS. 1-10.

Figure 1:
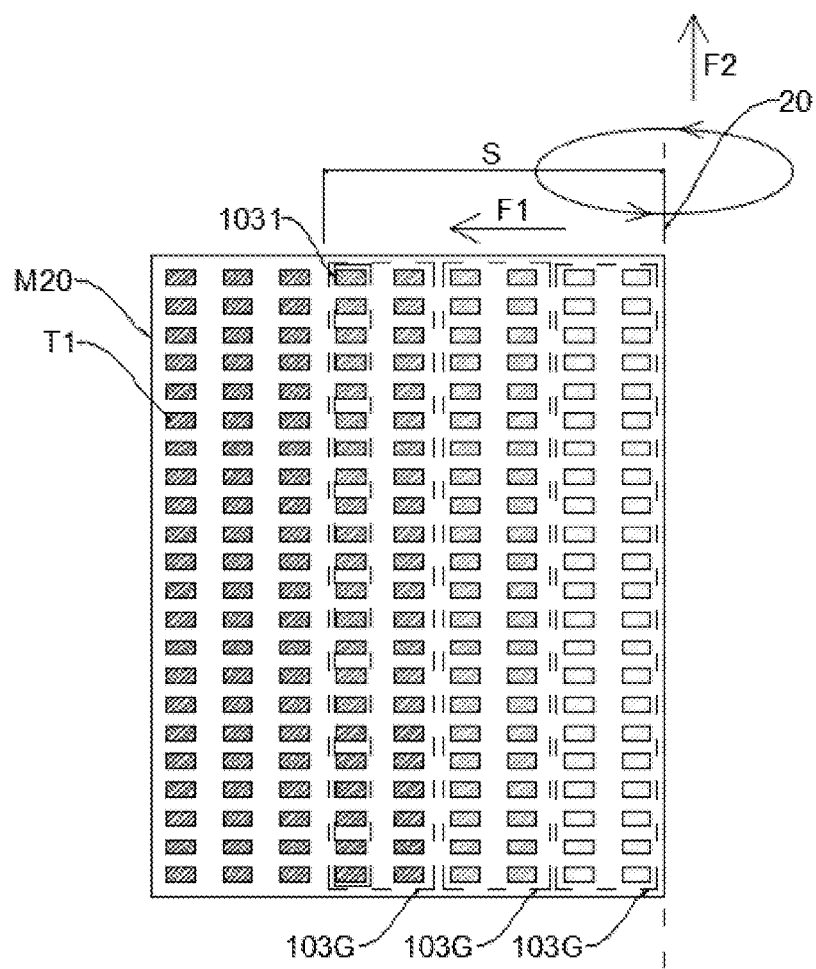
FIG. 1 is a schematic structural diagram of a display device provided by an embodiment of the present application.
Figure 4:
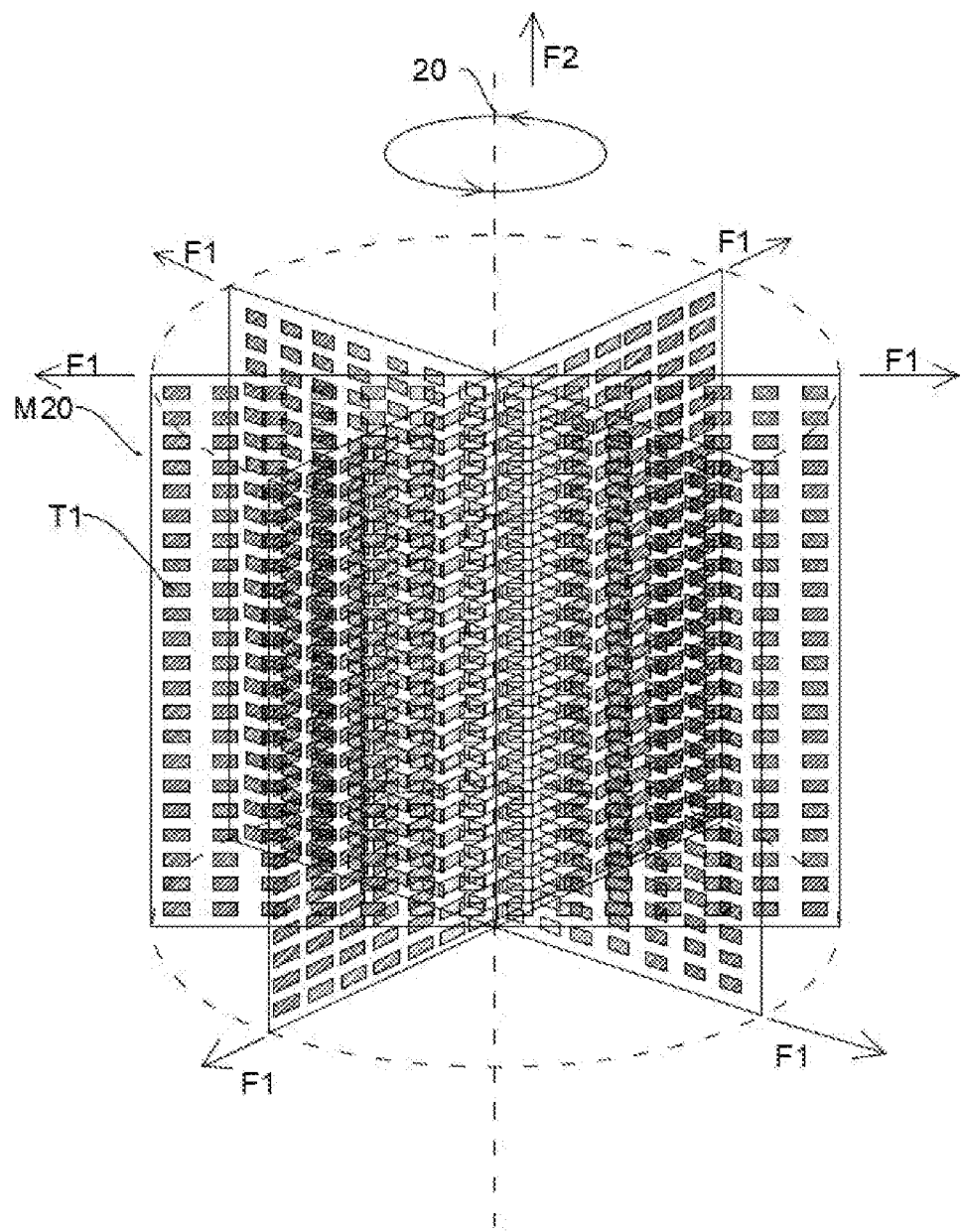
FIG. 4 is a schematic diagram of a layer structure of a driving device in a display device provided by an embodiment of the present application.
Figure 5:
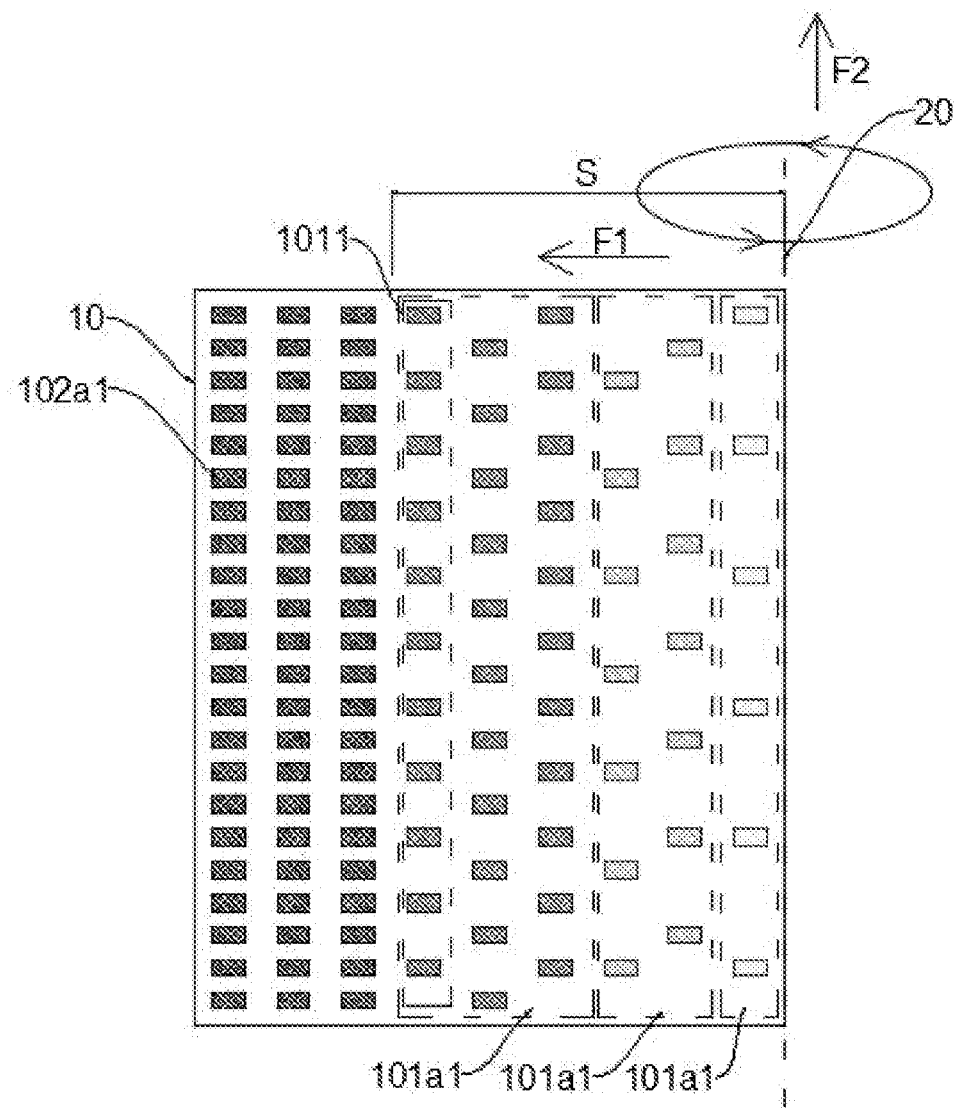
FIG. 5 is a schematic diagram showing a distribution of light emitting devices of a display panel provided by an embodiment of the present application.

An embodiment of the present application provides a display device, as shown in FIG. 1 and FIG. 4, comprising:

At least one display panel 10, and the display panel 10 rotates around a rotation axis 20. The display panel 10 comprises a light emitting layer M10 and a driving device layer M20 that are stacked. The light emitting layer M10 comprises a plurality of first light emitting devices 102a1, and the driving device layer M20 comprises a plurality of driving thin film transistor groups 103G arranged in sequence along a first direction F1. One driving thin film transistor group 103G comprises at least two driving thin film transistors T1, one driving thin film transistor group 103G T1 is connected to one first light emitting device 102a1, and the first direction F1 is perpendicular to the rotation axis 20.

Herein, the driving thin film transistor T1 is used to control a driving current of the first light emitting device 102a1. In the first direction F1, the driving current of each of the driving thin film transistor groups 103G close to the rotation axis 20 is smaller than the driving current of each of the driving thin film transistors T1 in another driving thin film transistor group 103G away from the rotation axis 20.

Specifically, the display device is a three-dimensional display device, which realizes the display of three-dimensional images by setting the display panel 10 to rotate around the rotation axis 20. Herein, the rotation axis 20 can be a virtual axis or a physical axis, so the rotation axis 20 can be located on the display panel 10 (including on a side of the display panel 10, or on the display panel 10 to divide the display panel 10), or outside the display panel 10. In this embodiment, a display device in which the rotation axis 20 is located on a side of the display panel 10 is taken as an example for illustration.

Specifically, the display panel 10 may be an organic light-emitting semiconductor (organic electroluminescence display, OLED) display panel, or a mini/micro-LED display panel. The above-mentioned display panels have a faster response speed and can achieve higher refresh rate, which can further improve the color gamut and the display brightness of the display device.

Specifically, when there are multiple display panels 10, the multiple display panels 10 rotate around the same rotation axis 20. The display panel 10 can be a display panel 10 for double-sided display, or a display panel 10 for single-sided display. Specifically, adjustments may be made according to actual production conditions or requirements. This application uses the display panel 10 for single-sided display as an example for illustration.

Specifically, the first direction F1 is perpendicular to the rotation axis 20, and the first direction F1 extends from the rotation axis 20 to a side of the display panel 10 away from the rotation axis 20.

Figure 2:
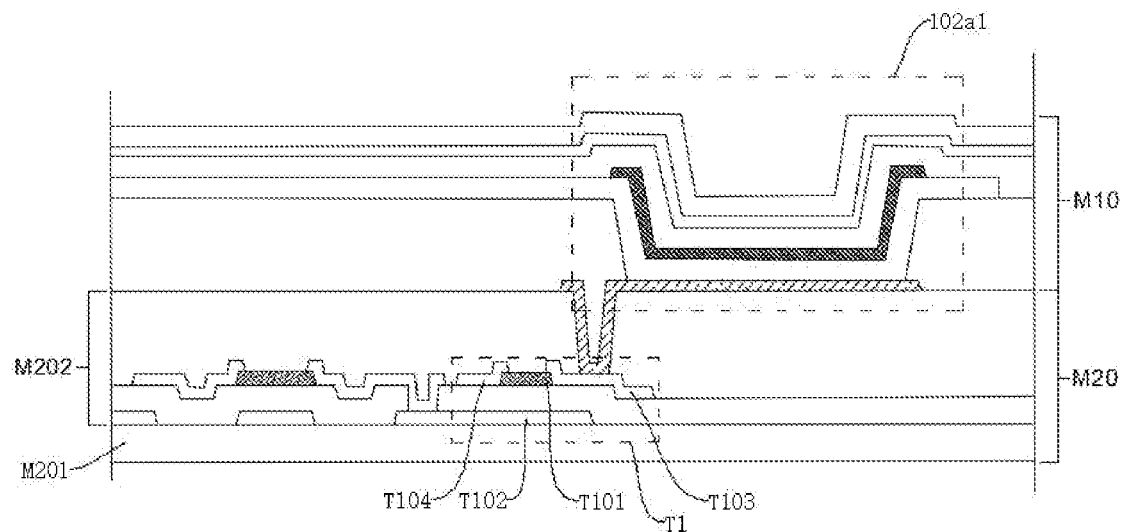
FIG. 2 is a schematic diagram of a film layer structure of a display panel provided by an embodiment of the present application.

Specifically, as shown in FIG. 2, the display panel 10 comprises a driving device layer M20 and a light emitting layer M10 disposed on the driving device layer M20. the light emitting layer M10 includes a plurality of first light emitting devices 102a1, the driving thin film transistor T1 on the driving device layer M20 is connected to its corresponding first light emitting device 102a1 to control the corresponding first light emitting device 102a1 to emit light.

Specifically, as shown in FIG. 2, the driving device layer M20 comprises a substrate M201 and a thin film transistor layer M202 disposed on the substrate M201. The thin film transistor layer M202 comprises a planarization layer disposed on the substrate M201, a gate layer (including a plurality of gate T102) disposed on the planarization layer, a gate insulating layer disposed on the gate layer, an active layer (comprising a plurality of channel portions T101) disposed on the gate insulating layer, and a source-drain layer (including a source T104 and a drain T103) disposed on the gate insulating layer and overlapping with the channel portion T101.

Specifically, the driving thin film transistor T1 at least comprises a gate T102, a source T104, a drain T103, and an active layer. The active layer comprises a channel portion T101 distributed between a source connection portion and a drain connection portion, so the source connection portion is connected to the source T104, and the drain connection portion is connected to the drain T103.

Specifically, the display panel 10 also includes a plurality of control circuits, one of the plurality of control circuits controls at least one of the first light-emitting devices 102a1 to emit light and display (including switch and brightness adjustment of the first light-emitting device 102a1). In the embodiment of the present application, the description will be made by taking a control circuit controlling a first light emitting device 102a1 to emit light as an example, but the application is not limited thereto. A control circuit can synchronously control two or more first light emitting devices 102a1 to emit light. The control circuit is formed on the substrate M201 of the driving device layer M20 and can be adjusted based on the production conditions.

Specifically, the control circuit may comprise a first thin film transistor, a second thin film transistor, a third thin film transistor, and a storage capacitor Cst. Herein, the first thin film transistor is the driving thin film transistor T1, the second thin film transistor is a switch thin film transistor, and the third thin film transistor is a detection thin film transistor. The first thin film transistor controls the brightness of the first light emitting device 102a1.

Specifically, the voltages connected to the driving thin film transistors T1 are the same.

Specifically, the driving thin film transistor T1 is a low temperature polysilicon thin film transistor, an oxide semiconductor thin film transistor, or an amorphous silicon thin film transistor.

Specifically, the specific connection method of the control circuit is described as follows. The gate of the second thin film transistor is electrically connected to a scanning voltage signal line, the source is electrically connected to a data voltage signal line, and the drain is electrically connected to the gate of the first thin film transistor T102 and one end of the storage capacitor Cst. The source T104 of the first thin film transistor is electrically connected to a positive voltage of a power supply, and the drain T103 is electrically connected to an anode of the first light emitting device 102a1. The cathode of the first light emitting device 102a1 is electrically connected to a negative voltage of the power supply, one end of the storage capacitor Cst is electrically connected to the drain of the second thin film transistor and the gate T102 of the first thin film transistor, and the other end of the storage capacitor Cst is electrically connected to the drain T103 of the first thin film transistor, the anode of a light-emitting device 102a1 and the source of the third thin film transistor. The gate of the third thin film transistor is electrically connected to the data signal, the source is electrically connected to the drain T103 of the first thin film transistor, and the drain of the third thin film transistor is connected to a detection voltage, and the detection voltage (VCM) connected to the drain T103 of the third thin film transistor is a constant voltage.

The control circuit controls a reset period of the first light-emitting device 102a1, and the scanning voltage and data of the control circuit are respectively applied to the gate T102 and the source T104 of the second thin film transistor in the control circuit. During the data writing period of each control circuit, the third switching thin film transistor in the control circuit is turned on to apply the data voltage to the drain T103 of the first thin film transistor. When the control circuit controls a light emitting period of the first light emitting device 102a1, the first thin film transistor is turned on so that the first light emitting device 102a1 connected to the drain T103 of the thin film transistor emits light.

Specifically, the plurality of driving thin film transistors T1 comprises a plurality of driving thin film transistor groups 103G arranged in sequence along the first direction F1, and a distance between each driving thin film transistor group 103G and the rotation axis 20 is within a predetermined distance S. Each driving thin film transistor group 103G comprises at least two driving thin film transistors T1, the first direction F1 is perpendicular to the rotation axis 20, and the first direction F1 is extending from the rotation axis 20 toward a side of the display panel 10 away from the rotation axis 20.

Herein, within the range of the predetermined distance S is a brightness adjustment range, and when outside the range of the predetermined distance S, the driving current value of each driving thin film transistor T1 reaches the maximum value under normal working conditions, and the driving current of each driving thin film transistor T1 is equal.

Specifically, in the control circuit, the driving thin film transistor T1 controls the brightness of the first light emitting device 102a1. When the display panel 10 displays, the greater the driving current passing through the driving thin film transistor T1, the brightness of the light emitting device 102a1 is greater. That is, when the first light emitting device 102a1 emits light, the brightness of the first light emitting device 102a1 is positively correlated with a magnitude of the driving current passing through the driving thin film transistor T1.

Specifically, the method for controlling the magnitude of the driving current flowing through the driving thin film transistor T1 comprises, but is not limited to, to realize the control of the magnitude of the driving current of the driving thin film transistors T1 in different rows or columns by pre-setting the driving chip of the display panel 10 or connecting resistors with different resistance values in series on the control circuit.

It can be understood that, by setting the display panel 10 to rotate around a rotation axis 20, the display panel 10 comprises a plurality of driving thin film transistors T1 arranged at intervals and a plurality of first light emitting devices 102a1 arranged at intervals, and one of the driving thin film transistors T1 is connected to one first light emitting device 102a1.

The plurality of driving thin film transistors T1 comprises a plurality of driving thin film transistor groups 103G arranged in sequence along the first direction F1, and the distance between each driving thin film transistor group 103G and the rotation axis 20 is within a predetermined distance range S, and one driving thin film transistor group 103G comprises at least two driving thin film transistors T1. When the driving thin film transistor T1 controls the first light emitting device 102a1 to emit light, in the first direction F1, a driving current of each driving thin film transistor T1 in the thin film transistor group 103G close to the rotation axis 20 is smaller than a driving current of each driving thin film transistor T1 in another thin film transistor group 103G away from the rotation axis 20. Since the driving thin film transistor T1 controls the first light emitting device 102a1 to emit light, and a brightness of the first light-emitting device 102a1 is positively correlated with a magnitude of the driving current in the driving thin-film transistor T1, the greater the driving current in the driving thin film transistor T1, the greater brightness of the first light-emitting device 102a1. The driving current of the driving thin film transistor T1 in the driving thin film transistor group 103G is smaller than the driving current of the driving thin film transistor T1 in the driving thin film transistor group 103G far away from the rotation axis 20, which can solve the uneven brightness problem of the three-dimensional display device due to different rotational speeds of the first light-emitting devices 102a1 in various locations of the display panel 10 and further improves the display brightness uniformity of the three-dimensional display device.

In one embodiment, one driving thin film transistor group 103G comprises at least one driving thin film transistor sub-group 1031, one driving thin film transistor sub-group 1031 sub-group at least two driving thin film transistors T1, and at least two of the driving thin film transistors T1 in the driving thin film transistor sub-group are evenly arranged at intervals along a second direction F2. The second direction F2 is parallel to the rotation axis 20.

When the driving thin film transistor T1 controls the first light emitting device 102a1 to emit light, in at least one driving thin film transistor group 103G, the driving current of each driving thin film transistor T1 in each of the driving thin film transistor sub-groups 1031 is equal in magnitude.

Specifically, the driving current of the driving thin film transistors T1 in each of the driving thin film transistor sub-groups 1031 in one driving thin film transistor group 103G is equal in magnitude, but this does not limit the driving current T1 of the driving thin film transistors in all driving thin film transistor groups 103G to be equal in magnitude, so that the driving current of the driving thin film transistors T1 in the multiple driving thin film transistor groups 103G show an overall increasing trend in the first direction F1. That is, the driving currents at some positions of the thin film transistors T1 can be equal in magnitude, so that the brightness adjustment flexibility of the display panel 10 is higher without affecting the brightness uniformity displayed by the display device.

Specifically, in the same driving thin film transistor sub-group 1031, in the second direction F2, the driving current of a plurality of driving thin film transistors T1 may be equal or unequal and can be adjusted specifically according to the shape of the display panel 10 of the display device, or actual rotation conditions of the rotation axis 20, so that the display brightness uniformity of the display device is higher.

It can be understood that by setting the distribution density of the first light-emitting devices 102a1 in each of the driving thin film transistor sub-groups 1031 in at least one driving thin film transistor group 103G to be the same, the adjustment flexibility of the brightness of the display panel 10 of the display device is higher, and the brightness uniformity displayed by the display device is not affected.

Figure 3:
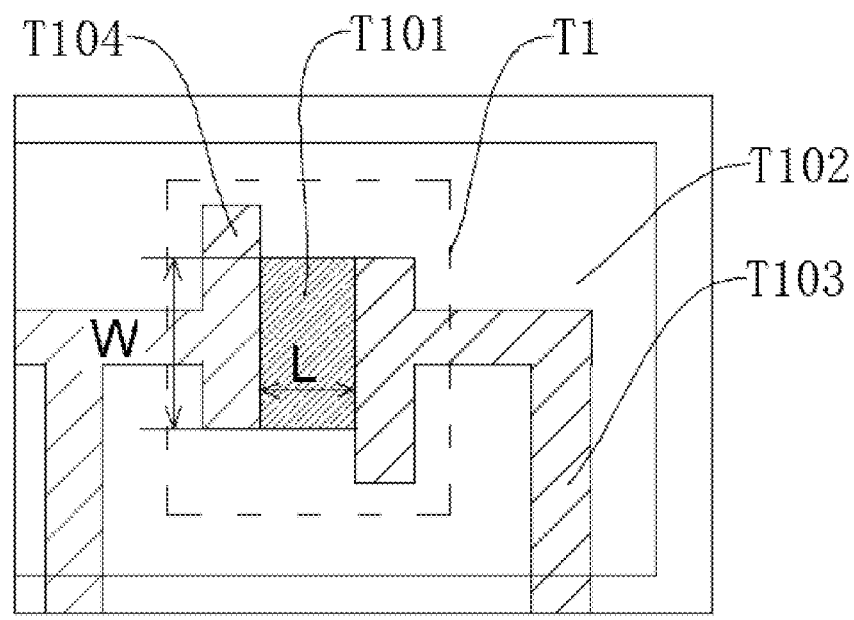
FIG. 3 is a top view of a partial structure of a driving device layer provided by an embodiment of the present application.

In accordance with the above embodiment, as shown in FIG. 2 and FIG. 3, the display panel 10 comprises a driving device layer M20. The driving device layer M20 comprises an active layer, and the driving thin film transistor T1 comprises a channel portion T101 located on the active layer.

In the first direction F1, a width-to-length ratio of the channel portion T101 of the driving thin film transistor T1 in the driving thin film transistor group 103G close to the rotation axis 20 is smaller than a width-to-length ratio of the channel portion T101 of the driving thin film transistor T1 in the driving thin film transistor group 103G away from the rotation axis 20.

Specifically, in the driving thin film transistor T1, as the width-to-length ratio of the channel portion T101 decreases, and an on-state current of the driving thin film transistor T1 decreases accordingly.

Specifically, the width of the channel portion T101 is shown as W in FIG. 3, which is the length of the opposite portion between the source T104 and the drain T103. The length of the channel portion T101 is shown as L in FIG. 3, that is, the distance between the source T104 and the drain T103.

It can be understood that by adjusting the width-to-length ratio of the channel portion T101 in the driving thin film transistor T1, the magnitude of the on-state current of the driving thin film transistor T1 can be controlled, and then the brightness of the first light emitting device 102a1 can be adjusted. This technical solution greatly simplifies the complexity of the display method of the display device, has high universality, and does not require additional changes to the physical structure of the rotating device.

In one embodiment, the display panel 10 comprises a substrate M201 and a thin film transistor layer M202 disposed on the substrate M201, and the material of the substrate M201 is a transparent material.

Specifically, the material of the substrate M201 may be transparent glass, polyimide and the like.

Specifically, the thin film transistor layer M202 comprises a plurality of driving thin film transistors T1, and the thin film transistor layer M202 comprises an insulating layer, an active layer, a gate layer, a source-drain layer T103 that are stacked. Herein, the active layer comprises a channel portion T101, a source connection portion T104 and a drain connection portion T103 arranged on both sides of the channel portion T101. Herein, the source T104 connection portion is connected to the source T104, and the drain connection portion T103 is connected to the drain T103. The gate T102 on the gate layer can be arranged above or below the channel portion T101 (it is located at the bottom shown in FIG. 2), and its projection in a direction perpendicular to the driving device layer M20 covers the channel portion T101.

It can be understood that by setting the material of the substrate M201 of the thin film transistor layer M202 as a transparent material, the display device has higher transparency, making the image displayed by the three-dimensional display device more realistic, and improving user experience.

In one embodiment, as shown in FIG. 5, FIG. 6, FIG. 7 and FIG. 8, the display panel 10 comprises a light-emitting layer, and the light-emitting layer comprises a plurality of first light-emitting device groups 101a1 arranged in sequence along the first direction F1. The distance between each first light emitting device group 101a1 and the rotation axis 20 is within the range of the predetermined distance S, and one first light emitting device group 101a1 comprises at least two first light emitting device groups 102a1.

In the first direction F1, a distribution density of the first light emitting devices 102a1 in the first light emitting device group 101a1 close to the rotation axis 20 is smaller than a distribution density of the first light emitting devices 102a1 in the first light emitting device group 101a1 away from the rotation axis 20.

Figure 7:
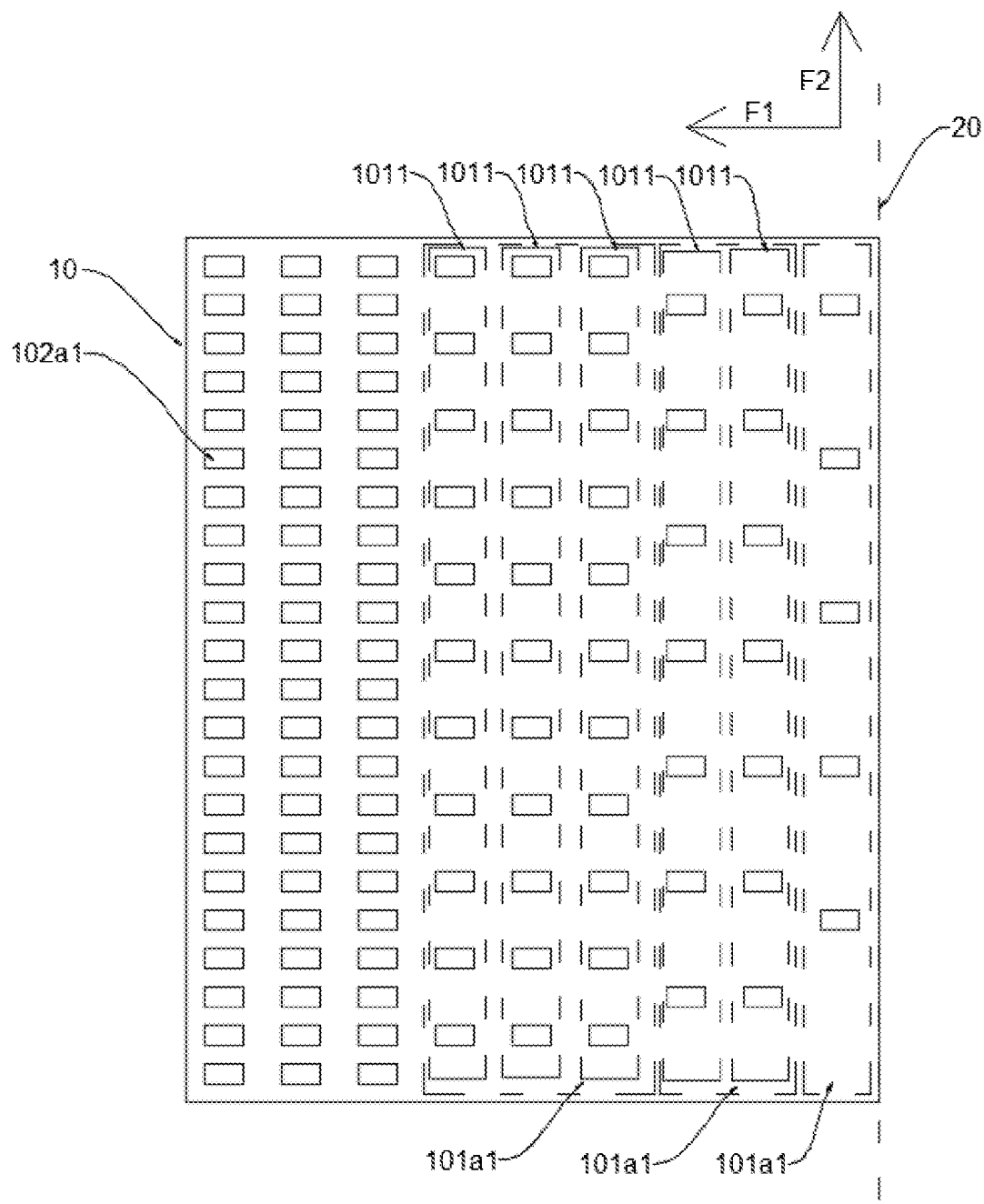
FIG. 7 is a schematic diagram showing a layout of light emitting devices of a display panel provided by an embodiment of the present application.
Figure 8:
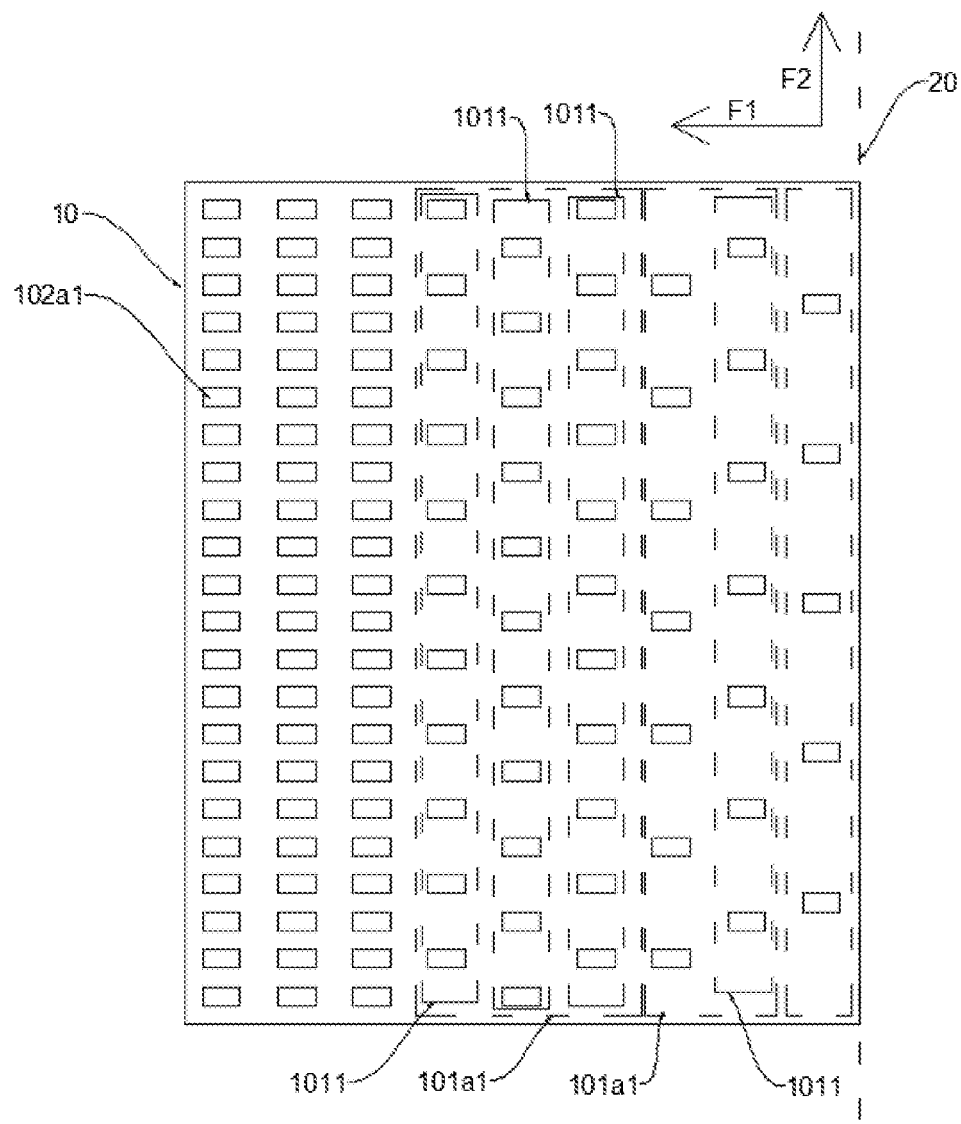
FIG. 8 is a schematic diagram showing a layout of light emitting devices of a display panel provided by an embodiment of the present application.

Specifically, the spacing between the plurality of first light emitting device groups 101a1 may be the same or different, and there is no limitation here, but the different spacing between the plurality of first light emitting device groups 101a1 cannot affect the uniformity of light emission of the display device. Both FIG. 7 and FIG. 8 are situations in which the spacing between the plurality of first light emitting device groups 101a1 is the same.

Specifically, one first light-emitting device group 101a1 comprises at least two first light-emitting device groups 102a1, and the lengths of the plurality of first light-emitting device groups 101a1 in the second direction F2 (parallel to the rotation axis 20) are the same.

Figure 9:
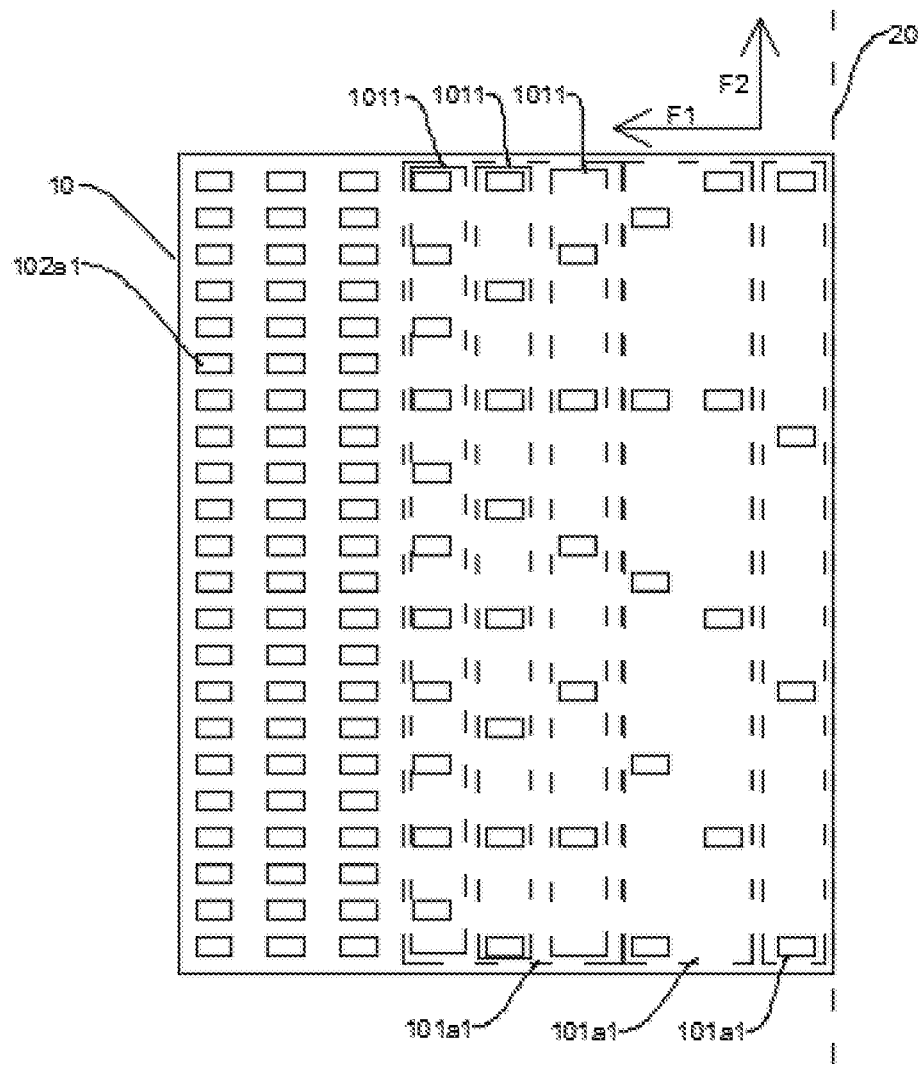
FIG. 9 is a schematic diagram showing a layout of light emitting devices of a display panel provided by an embodiment of the present application.

Specifically, when the first light emitting device group 101a1 comprises a plurality of first light emitting devices 102a1 arranged at intervals, the distribution density of the first light emitting devices 102a1 in the first light emitting device group 101a1 may also gradually increase in the direction F1 (as shown in FIG. 9), or the plurality of first light emitting devices 102a1 in the first light emitting device group 101a1 are evenly distributed.

Specifically, the distribution density refers to the number of the first light-emitting devices 102a1 in the same unit area, where the length of a unit area may be the same as the length of a side of the display panel 10 parallel to the rotation axis 20, and the width of the unit panel is at least greater than the width of one first light emitting device 102a1.

Specifically, in an example, assuming that the initial arrangement of the first light-emitting devices 102a1 is set to m rows and n columns, and the display panel 10 is refreshed when the display panel 10 is rotated by α degrees, then following conditions are satisfied:

The number N of the first light emitting devices 102a1 in the $t^{th}$ column$\geq [(360 \times m \times t)/(\alpha \times n)]$; and and the first light emitting devices 102a1 are evenly distributed on the column, and t is a positive integer greater than 1 and less than or equal to n.

The above-mentioned technical solution can be adopted to make the use of the first light-emitting device 102a1 on the display panel 10 in the highest efficiency state.

It can be understood that, by setting the display panel 10 to comprise a plurality of first light emitting devices 102a1 arranged at intervals, the first light emitting devices 102a1 and the driving thin film transistors T1 have a one-to-one correspondence relationship, and the plurality of first light emitting devices 102a1 comprise a plurality of light-emitting device group 101a1. The distance between each first light-emitting device group 101a1 and the rotation axis 20 is within a predetermined distance S, a first light-emitting device group 101a1 comprises at least two first light-emitting devices 102a1, and a plurality of first light-emitting device groups 101a1 are arranged in sequence along the first direction F1. In the first direction F1, the distribution density of the first light-emitting devices 102a1 in the first light-emitting device group 101a1 close to the rotation axis 20 is smaller than the distribution density of the first light-emitting devices 102a1 in another first light-emitting device group 101a1 away from the rotation axis 20. By reducing the distribution density of the first light-emitting devices 102a1 close to the rotation axis 20, the luminance of the first light-emitting device 102a1 within a predetermined range close to the rotation axis 20 can be consistent with the luminance of the first light-emitting device 102a1 outside the predetermined range when performing three-dimensional display, and cooperate with the technical solution of adjusting the driving current in the corresponding driving thin film transistor T1, the problem in the three-dimensional display device that the first light-emitting device 102a1 at different positions on the display panel 10 has the problem of uneven brightness on the display device as a whole due to different rotational speeds can be solved on the one hand, which further improves the display brightness uniformity of the three-dimensional stereoscopic display device. On the other hand, through comprehensive use of the two technologies, the problem of excessive distance between the first light-emitting devices 102a1 close to the rotation axis 20 and uneven brightness distribution caused by a single adjustment of the distribution density of the first light-emitting devices 102a1 can be solved, which affects the PPI displayed by the display device and affects the display effects.

In one embodiment, as shown in FIG. 7 and FIG. 8, a first light emitting device group 101a1 comprises at least one first sub-group 1011, and a first sub-group 1011 comprises at least two first light emitting devices 102a1. The at least two the first light emitting devices 102a1 in the first sub-group 1011 are arranged sequentially along the second direction F2, the second direction F2 is parallel to the rotation axis 20, and the distribution density of the first light emitting devices 102a1 in each of the first sub-groups 1011 in the first sub-group 101a1 of at least one of the first light emitting device groups is the same.

Specifically, the plurality of first light-emitting device groups 101a1 includes a plurality of first sub-groups 1011, and the plurality of first sub-groups 1011 can be arranged in sequence along the first direction F1, and the first sub-groups 1011 The first light emitting devices 102a1 are arranged in sequence along the second direction F2.

Figure 6:
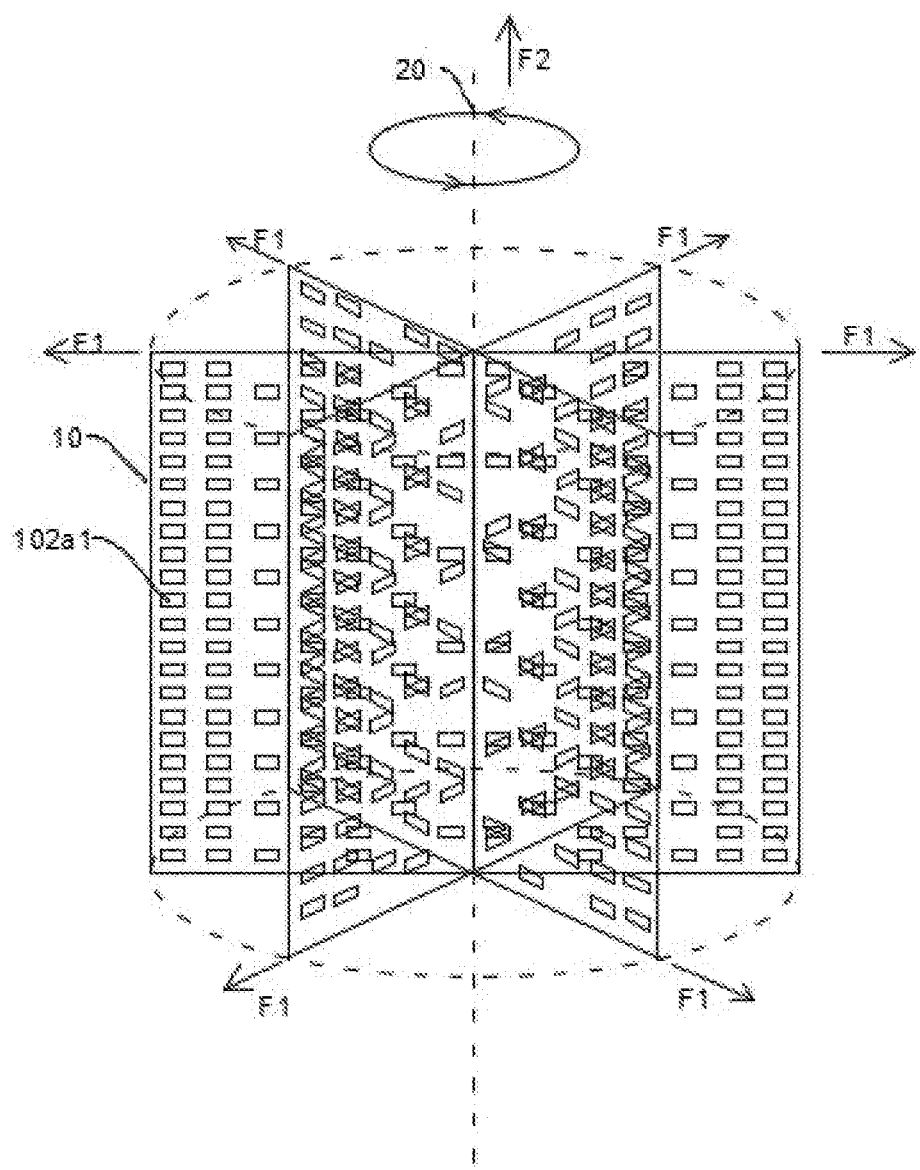
FIG. 6 is a schematic structural diagram of another display device provided by an embodiment of the present application.

Specifically, the distribution density of the first light-emitting devices 102a1 in each the first sub-group 1011 in a first light-emitting device group 101a1 is the same, but it does not limit the distribution density of the distribution density of the first light-emitting devices 102a1 in the first sub-group 1011 of all the first light-emitting device groups 101a1 is the same, so that the plurality of light-emitting units of the plurality of light-emitting unit groups shows a trend of increasing distribution density as a whole. Specially, as shown in FIG. 6 and FIG. 7, the distribution densities of the first light-emitting devices 102a1 at some positions may be the same, so that the brightness adjustment flexibility of the display panel 10 is higher without affecting the brightness uniformity displayed by the display device.

Specifically, in the same first sub-group 1011, a plurality of first light-emitting devices 102a1 can be evenly disposed at intervals, or can have multiple spacing distances, which can be based on the shape of the display panel 10 of the display device or the actual rotation of the rotating axis 20. Adjustments are made to increase the display brightness uniformity of the display device.

It can be understood that by setting the distribution density of the first light emitting devices 102a1 in each of the first sub-groups 1011 in at least one of the first light emitting device groups 101a1 to be the same, the brightness adjustment flexibility of the display panel 10 of the display device can be higher, and the brightness uniformity displayed by the display device is not affected.

In one embodiment, a first light emitting device group 101a1 comprises at least two first sub-groups 1011 arranged along the first direction F1, the first sub-group 1011 comprises a plurality of first light emitting devices device 102a1, and the plurality of the first light emitting devices 102a1 are evenly spaced along the second direction F2.

It should be noted that since the display panel 10 rotates around the rotation axis 20, the reason why the display panel 10 rotates correspondingly produces bright lines is that the rotation speeds of the first light-emitting devices 102a1 are different in the first direction F1, but the rotational speeds of the first light emitting devices 102a1 are the same in the second direction F2.

It can be understood that setting the first light-emitting devices 102a1 in the first sub-group 1011 to be evenly spaced in the second direction F2 can make the display brightness of the display panel 10 in the second direction F2 more uniform and improve the display brightness uniformity of the display device.

In one embodiment, in any two adjacent first sub-groups 1011, the first light emitting devices 102a1 in one of the first sub-groups 1011 and the first light emitting devices 102a1 in the other first light emitting devices 102a1 are alternately arranged along the second direction F2.

Specifically, in this embodiment, the alternate arrangement means that in the first direction F1, the two adjacent first sub-groups 1011 are the first sub-group 1011 and the second first sub-group 1011, respectively, The first light emitting devices 102a1 in the first sub-group 1011 are not arranged in the same row as the first light emitting devices 102a1 in the second first sub-group 1011.

It can be understood that, in any adjacent two first sub-groups 1011, the first light emitting device 102a1 in one first sub-group 1011 and the first light emitting device 102a1 in the other first sub-group 1011 are alternately arranged along the second direction F2, which can effectively prevent the problem of horizontal bright lines caused by the concentration of the first light-emitting devices 102a1 in some positions during the display process of the display device, and further improve the display uniformity of the display device.

In an embodiment, one of the first light emitting device groups 101a1 comprises at least two of the first sub-groups 1011, and in any two of the first light emitting device groups 101a1, the distance between the first sub-groups 1011 in one of the first light emitting device groups 101a1 is equal to the distance between the first sub-groups 1011 in the other first light emitting device group 101a1.

Specifically, the distance between the first sub-groups 1011 in one of the first light emitting device groups 101a1 that equals to the distance between the first sub-groups 1011 in the other first light emitting device group 101a1 can be understood that the arrangement of each first sub-group 1011 is uniform in the first direction F1 even in any first light emitting device group 101a1.

It can be understood that by setting the distance between the first sub-groups 1011 in one first light emitting device group 101a1 and the first sub-groups 1011 in another first light emitting device group 101a1 to be the same, which can make the brightness of the display panel 10 in the first direction F1 more uniform and facilitate the production of the display panel 10 at the same time.

Figure 10:
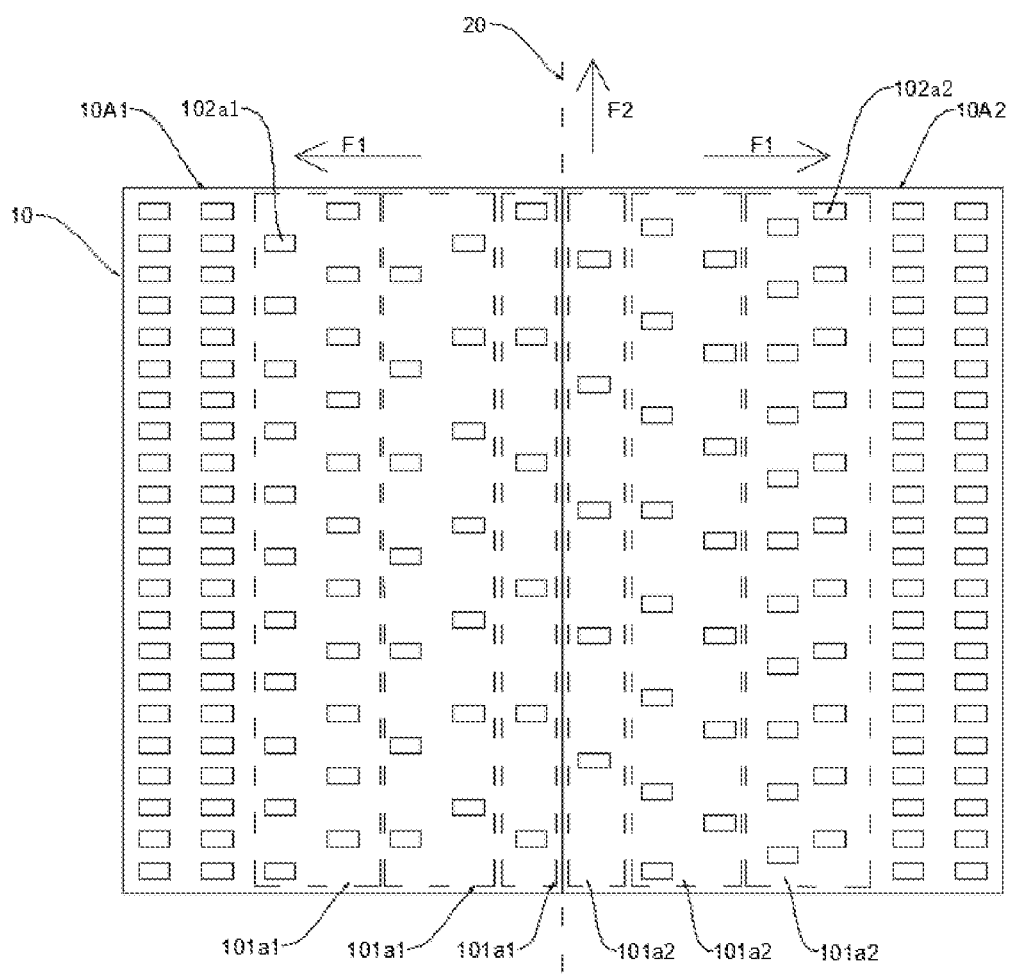
FIG. 10 is a schematic diagram showing a layout of light emitting devices of a display panel provided by an embodiment of the present application.

In one embodiment, as shown in FIG. 10, the rotating axis 20 divides the display panel 10 into a first display portion 10A1 and a second display portion 10A2. The first display portion 10A1 comprises a plurality light emitting device 102a1, and the second display portion 10A2 comprises a plurality of second light emitting device groups 101a2. The plurality of second light emitting device groups 101a2 are arranged along the first direction F1, and the second device group comprises a plurality of second light emitting device 102a2.

Herein, in the first light emitting device group 101a1 and the second light emitting device group 101a2 having the same length from the rotation axis 20, the plurality of first light emitting devices 102a1 on the first light emitting device group 101a1 and the plurality of second light emitting devices 102a2 on the second light emitting device group 101a2 are alternately arranged along the second direction F2.

It should be noted that when there are two or more display panels 10 (or two or more display portions) on the rotating axis 20 rotating around the rotating axis 20, and this embodiment takes two display portions as an example for illustration. When some of the light emitting devices 102 on the two display portions are symmetrical about the rotation axis 20, the corresponding symmetrical portions make the brightness of the corresponding positions overlap when the display device is displaying, resulting in bright spots or bright lines, which affect the display effect of the three-dimensional display. In order to avoid the above technical problems, the technical solution of this embodiment is provided.

Specifically, in this embodiment, the display panel 10 may be a whole display panel 10 or may be a spliced display panel 10. If it is a spliced display panel 10, the splicing seam and the rotating axis 20 coincide.

Specifically, in this embodiment, the first display portion 10A1 and the second display portion 10A2 may have the same or different area sizes. In this embodiment, the first display portion 10A1 and the second display portion A2 having the same area size will be described as an example.

Specifically, since the first display portion 10A1 and the second display portion 10A2 are arranged symmetrically (symmetry in shape), but the first light emitting device 102a1 on the first display portion 10A1 and the second light emitting device 102a2 on the second display portion 10A2 are arranged asymmetrically.

Specifically, a changing rate of the first light-emitting devices 102a1 on the first display portion 10A1 (the changing rate of the distribution density of the plurality of first light-emitting devices 102a1 relative to the distance from the rotation axis 20) and the changing rate of the second light emitting devices 102a2 on the second display portion 10A2 (the changing rate of the distribution density of the plurality of second light emitting devices 102a2 relative to the distance from the rotation axis 20) is the same.

Specifically, in the first direction F1, the first light-emitting device group 101a1 and the second light-emitting device group 101a2 have the same length from the rotation axis 20, and the first light-emitting device 102a1 in the first light-emitting device group 101a1 and the second light emitting devices 102a2 in the second light emitting device groups 101a2 are arranged in different rows.

In other words, in this embodiment, the first display portion 10A1 overlaps the second display portion 10A2 after rotating around the rotation axis 20, but the first light emitting device 102a1 on the first display portion 10A1 overlaps with the second display portion 10A1. The second light emitting devices 102a2 on the second display portion 10A2 do not overlap.

Alternatively, the rotation paths of the plurality of first light emitting devices 102a1 on the first light emitting device group 101a1 and the plurality of second light emitting devices 102a2 on the second light emitting device group 101a2 do not overlap.

Specifically, when three display panels 10 rotate around the rotation axis 20, and the three display panels 10 are relatively axisymmetric with respect to the rotation axis 20, after the three display panels 10 rotate and overlap around the rotation axis 20, the light emitting devices 102 on the three display panels 10 do not overlap each other.

It can be understood that, by adopting the above technical solution, the display effect of the display device can be made more uniform, and the arrangement of multiple display panels 10 will not produce bright lines or bright spots when the display device performs three-dimensional display, thereby improving the display effect of the display device and prolonging the service life of the display device.

In accordance with the above-mentioned embodiment, the distance from the side of the first display portion 10A1 away from the rotation axis 20 to the rotation axis 20 is the same as the distance from the side of the second display portion 10A2 away from the rotation axis 20 to the rotation axis 20.

Specifically, in this embodiment, the area of the first display portion 10A1 is equal to the area of the second display portion 10A2, and the shape of the first display portion 10A1 is the same as the shape of the second display portion 10A2. The changing rate of the first light emitting devices 102a1 on the first display portion 10A1 (the changing rate of the distribution density of the plurality first light emitting devices 102a1 relative to the distance from the rotation axis 20) is the same as the changing rate of the second display portion 10A1 (the changing rate of the second light-emitting devices 102a2 on the first display portion 10A2 is the same. The difference on the first display portion 10A1 is that the arrangement position of the first light-emitting devices 102a1 on the first display portion 10A1 is different from the arrangement positions of the light emitting devices 102 on the second display portion 10A2.

To sum up, by setting the display panel 10 to rotate around a rotation axis 20 to display, the display panel 10 comprises a light emitting layer and a driving device layer that are stacked. The light emitting layer comprises a plurality of first light emitting devices 102a1 arranged at intervals, and the driving device layer comprises a plurality of driving thin film transistor groups 103G arranged in sequence along the first direction F1. One of the driving thin film transistor groups 103G comprises at least two driving thin film transistors T1, and when the first light emitting device 102a1 emits light in the first direction F1, the driving current of each driving thin film transistor T1 in one of the driving thin film transistor groups 103G close to the rotation axis 20 is smaller than the driving current of each driving thin film transistor T1 in the other driving thin film transistor group 103G away from the rotation axis 20. Since the driving thin film transistors T1 controls the light-emitting device 102 to emit light, and the brightness of the first light-emitting device 102a1 is positively correlated with the magnitude of the driving current in the driving thin-film transistor T1. The larger the driving current in the driving thin-film transistor T1, the higher the brightness of the first light-emitting device 102a1. Therefore, the driving current of the driving thin film transistor T1 in the driving thin film transistor group 103G close to the rotation axis 20 is set to be smaller than the driving current of the driving thin film transistor T1 in the driving thin film transistor group 103G away from the rotation axis 20, which can solve the problem of the three-dimensional display device, which is the brightness unevenness caused by the first light-emitting device 102a1 at different positions on the display panel 10 due to the difference in rotational linear speed, and the display brightness uniformity of the three-dimensional display device is further improved.

A display device provided by the embodiments of the present invention have been described above in detail. In this paper, specific examples are used to illustrate the principles and implementations of the present invention. The descriptions of the above embodiments are only used for Help to understand the technical solution of the present invention and its core idea; those of ordinary skill in the art should understand. It can still modify the technical solutions recorded in the foregoing embodiments or perform equivalent replacements to some of the technical features. and these modifications can be made alternatively, the essence of the corresponding technical solution does not deviate from the scope of the technical solutions of the embodiments of the present invention.

What is claimed is:

1. A display device, comprising:
   at least one display panel, wherein the display panel is configured to rotate around a rotation axis to display, the display panel comprises a light emitting layer and a driving device layer that are stacked, the light emitting layer comprises a plurality of first light emitting devices arranged at intervals, the driving device layer comprises a plurality of driving thin film transistor groups arranged in sequence along a first direction, one of the driving thin film transistor group comprises at least two driving thin film transistors, one of the driving thin film transistor is connected to one of the first light emitting devices, and the first direction is perpendicular to the rotation axis;
   wherein a driving current of each of the driving thin film transistors in the driving thin film transistor group close to the rotation axis is smaller than a driving current of each of the driving thin film transistors in the other driving thin film transistor group away from the rotation axis when the first light-emitting device emits light;
   wherein the light-emitting layer comprises a plurality of first light-emitting device groups arranged in sequence along the first direction, and the first light-emitting device group comprises at least two of the first light emitting devices; and
   a distribution density of each of the first light emitting devices in the first light emitting device group close to the rotation axis is smaller than a distribution density of each of the first light emitting devices in another first light emitting device group away from the rotation axis in the first direction.

2. The display device according to claim 1, wherein one of the driving thin film transistor groups comprises a plurality of driving thin film transistor sub-groups arranged along the first direction, and one of the driving thin film transistor sub-groups comprises at least two driving thin film transistors, the at least two driving thin film transistors in the driving thin film transistor sub-group are evenly arranged at intervals along a second direction, and the second direction is parallel to the rotation axis; and
   the driving currents of the driving thin film transistors in each of the driving thin film transistor sub-groups are equal in magnitude in at least one of the driving thin film transistor groups when the light emitting device emits light.

3. The display device according to claim 1, wherein the thin film transistor is a low temperature polysilicon thin film transistor, an oxide semiconductor thin film transistor, or an amorphous silicon thin film transistor.

4. The display device according to claim 1, wherein the display panel comprises a plurality of control circuits, and one of the plurality of control circuits controls at least one of the first light-emitting devices to emit light and display;
   the control circuit comprises a first thin film transistor, a second thin film transistor, a third thin film transistor, and a storage capacitor, the first thin film transistor is the driving thin film transistor, the second thin film transistor is a switching thin film transistor, and the third thin film transistor is a detecting thin film transistor.

5. The display device according to claim 1, wherein an arrangement of the first light-emitting devices is set to m rows and n columns, and the display panel is refreshed when the display panel is rotated by a degrees, then following conditions are satisfied:
   the number N of the first light emitting devices in the $t^{th}$ column $\geq [(360 \times m \times t)/(\alpha \times n)]$; and
   wherein the first light emitting devices are evenly distributed on the column, and t is a positive integer greater than 1 and less than or equal to n.

6. The display device according to claim 1, wherein a distance between each driving thin film transistor group and the rotation axis 20 is within a predetermined distance, and a distribution density of the first light emitting devices is equal outside the predetermined distance.

7. The display device according to claim 1, wherein a width-length ratio of a channel portion of the driving thin film transistor in the driving thin film transistor group close to the rotation axis is smaller than a width-to-length ratio of the channel portion of the driving thin film transistor in another driving thin film transistor group away from the rotation axis in the first direction.

8. The display device according to claim 7, wherein the driving thin film transistor at least comprises a gate, a source, a drain, and an active layer, and the active layer comprises a channel portion distributed between the source and the drain.

9. The display device according to claim 1, wherein the display panel comprises a substrate, the driving device layer is disposed on the substrate, and a material of the substrate is a transparent material.

10. The display device according to claim 9, wherein a material of the substrate is transparent glass or polyimide.

11. The display device according to claim 1, wherein a distance between each of the first light-emitting device groups and the rotation axis is within a predetermined distance, and the distribution density of light emitting devices is equal outside the preset distance range.

12. The display module according to claim 11, wherein a distance between each of the driving thin film transistor groups and the rotation axis is within a predetermined distance, and the distribution density of the first light-emitting devices is equal and the values of the driving currents of the driving thin film transistors are equal outside the predetermined distance.

13. The display device according to claim 1, wherein the display panel comprises a first display portion and a second display portion respectively located on opposite sides of the rotation axis, and the plurality of the first light-emitting device groups located in the first display portion, the second display portion comprises a plurality of second light emitting device groups arranged along the first direction, and the second light emitting device group comprises a plurality of second light emitting devices;

wherein, in the first light emitting device group and the second light emitting device group having the same length from the rotation axis, rotation paths of the plurality of the first light emitting devices on the first light emitting device group and the plurality of second light emitting devices on the two light emitting device groups do not overlap.

14. The display device according to claim 13, wherein a changing rate of the distribution density of the first light-emitting devices on the first display portion and a changing rate of the distribution density of the second light-emitting devices on the second display portion are symmetrical about the rotation axis.

15. The display device according to claim 13, wherein a shape of the first display portion and a shape of the second display portion are symmetrical about the rotation axis.

16. The display device according to claim 1, wherein one of the first light-emitting device groups comprises at least one first sub-group, and the first sub-group comprises at least two of the first light-emitting devices, the at least two of the first light emitting devices in the first sub-group are arranged in sequence along a second direction, the second direction is parallel to the rotation axis, and the distribution density of the first light emitting devices in each of the first sub-groups in at least one first light emitting device group is the same.

17. The display device according to claim 16, wherein one of the first light-emitting device groups comprises at least two first sub-groups arranged in the first direction, and the first sub-group comprises a plurality of the first light-emitting devices, and the plurality of the first light-emitting devices are evenly arranged at intervals along the second direction.

18. The display device according to claim 16, wherein, in any two adjacent first sub-groups, the first light-emitting devices in one of the first sub-groups and the first light-emitting devices in the other first sub-group are arranged alternately along the second direction.

19. The display device according to claim 16, wherein one of the first light-emitting device groups comprises at least two of the first sub-groups, and, in any two of the first light-emitting device groups, a distance between one of the first sub-groups in one light emitting device group is equal to a distance between the first sub-groups in another first light emitting device group.

20. A display device, comprising:

at least one display panel, wherein the display panel is configured to rotate around a rotation axis to display, the display panel comprises a light emitting layer and a driving device layer that are stacked, the light emitting layer comprises a plurality of first light emitting devices arranged at intervals, the driving device layer comprises a plurality of driving thin film transistor groups arranged in sequence along a first direction, one of the driving thin film transistor group comprises at least two driving thin film transistors, one of the driving thin film transistor is connected to one of the first light emitting devices, and the first direction is perpendicular to the rotation axis;

wherein a driving current of each of the driving thin film transistors in the driving thin film transistor group close to the rotation axis is smaller than a driving current of each of the driving thin film transistors in the other driving thin film transistor group away from the rotation axis when the first light-emitting device emits light;

wherein the display panel comprises a plurality of control circuits, and one of the plurality of control circuits controls at least one of the first light-emitting devices to emit light and display;

the control circuit comprises a first thin film transistor, a second thin film transistor, a third thin film transistor, and a storage capacitor, the first thin film transistor is the driving thin film transistor, the second thin film transistor is a switching thin film transistor, and the third thin film transistor is a detecting thin film transistor.

* * * * *